(12) United States Patent
Takeyama et al.

(10) Patent No.: US 8,223,579 B2
(45) Date of Patent: Jul. 17, 2012

(54) SEMICONDUCTOR STORAGE DEVICE

(75) Inventors: Yasuhisa Takeyama, Yokohama (JP);
Osamu Hirabayashi, Tokyo (JP);
Takahiko Sasaki, Tokyo (JP); Yuki Fujimura, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 187 days.

(21) Appl. No.: 12/790,497

(22) Filed: May 28, 2010

(65) Prior Publication Data

US 2010/0302831 A1      Dec. 2, 2010

(30) Foreign Application Priority Data

May 28, 2009    (JP) .................................. 2009-128515

(51) Int. Cl.
*G11C 8/00*     (2006.01)
*G11C 11/00*    (2006.01)
(52) U.S. Cl. ................................................. 365/230.05
(58) Field of Classification Search ............. 365/230.05, 365/154
See application file for complete search history.

(56) References Cited

U.S. PATENT DOCUMENTS

| 7,430,134 B2 | 9/2008 | Takeyama et al. |
| 2007/0025140 A1* | 2/2007 | Redwine ........................ 365/154 |
| 2011/0007556 A1* | 1/2011 | Gong et al. .................... 365/154 |
| 2011/0188327 A1* | 8/2011 | Ishikura et al. ........... 365/189.15 |

FOREIGN PATENT DOCUMENTS

JP        10-027476        1/1998

OTHER PUBLICATIONS

Background Art Information.
Prior Art Information List.

* cited by examiner

*Primary Examiner* — Anh Phung
(74) *Attorney, Agent, or Firm* — Knobbe, Martens, Olson & Bear, LLP (57) ABSTRACT

A memory cell of a static random access memory (SRAM) includes a pair of drive transistors, a pair of load transistors, a pair of write-only transfer transistors, a pair of read-only transfer transistors, a pair of read-only drive transistors, and a pair of column selection transistors. The memory cell also includes a word line, a pair of write bit lines, a pair of read bit lines, and a column selection line.

20 Claims, 8 Drawing Sheets

SEMICONDUCTOR STORAGE DEVICE

CROSS-REFERENCE TO RELATED APPLICATIONS

This application is based upon and claims the benefit of priority from the prior Japanese Patent Application No. 2009-128515, filed on May 28, 2009; the entire contents of which are incorporated herein by reference.

BACKGROUND

1. Field

The present invention relates to a semiconductor storage device. In particular, the present invention is more suitably applied to a method of preventing corruption of data stored in a memory cell at the time of data writing and data readout even when a static noise margin in a static random access memory (SRAM) is small.

2. Description of the Related Art

A static random access memory (SRAM) is widely used as a computer cache memory and a mobile electronic product because the SRAM need not be refreshed and thereby consumes less power and operates at faster speed than a dynamic random access memory (DRAM). A memory cell used in such an SRAM can be a high-resistance cell and a complementary metal-oxide semiconductor (CMOS) cell. The CMOS cell is formed of six transistors, that is, a pair of transfer transistors, a pair of drive transistors, and a pair of load transistors.

Furthermore, there has been proposed a method for forming a memory cell of an SRAM by using ten transistors to increase a noise margin without lowering write performance, which is disclosed in, for example, Japanese Patent Application Laid-open No. H10-27476. In this memory cell, a combination of a first pass transistor and a first bit-line selection transistor that are connected in series is connected between an output node of a first inverter and a first bit line, a first write pass transistor is connected to the first pass transistor in parallel to each other, a combination of a second pass transistor and a second bit-line selection transistor that are connected in series is connected between an output node of a second inverter and a second bit line, and a second write pass transistor is connected to the second pass transistor in parallel to each other.

However, in the method of forming an SRAM by using six transistors, a transfer transistor in a non-selected cell that is connected to a word line on the same row as the selected cell is also turned on when data writing and data readout are performed. Therefore, when a static noise margin of the SRAM is small, write disturb and read disturb may occur, leading to corruption of data in the non-selected cell.

Furthermore, in the method disclosed in Japanese Patent Application Laid-open No. H10-27476, a bit line for writing data is shared as a bit line for reading data, so that read disturb may occur at the time of data readout, leading to corruption of data in the selected cell.

DETAILED DESCRIPTION

Exemplary embodiments of a semiconductor storage device according to the present invention are explained below with reference to the accompanying drawings. The present invention is not limited to the following embodiments.

A semiconductor storage device according to an embodiment comprises a first drive transistor; a second drive transistor; a first load transistor; a second load transistor; a first write-only transfer transistor; a second write-only transfer transistor; a first read-only drive transistor; a first read-only transfer transistor; a first column selection transistor; a second column selection transistor; a word line; a first write bit line; a second write bit line; a first read bit line; and a column selection line.

The first load transistor is connected to the first drive transistor in series. The second load transistor is connected to the second drive transistor in series. A drain of the first write-only transfer transistor is connected to a gate of the second drive transistor, a gate of the second load transistor, a drain of the first drive transistor, and a drain of the first load transistor. A drain of the second write-only transfer transistor is connected to a drain of the second drive transistor, a drain of the second load transistor, a gate of the first drive transistor, and a gate of the first load transistor. A gate of the first read-only drive transistor is connected to the gate of the first drive transistor, the gate of the first load transistor, the drain of the second drive transistor, and the drain of the second load transistor. A drain of the first read-only transfer transistor is connected to a drain of the first read-only drive transistor. A drain of the first column selection transistor is connected to a source of the first write-only transfer transistor. A drain of the second column selection transistor is connected to a source of the second write-only transfer transistor. The a word line is connected to a gate of the first write-only transfer transistor, a gate of the second write-only transfer transistor, and a gate of the first read-only transfer transistor; The first write bit line is connected to a source of the first column selection transistor. The second write bit line is connected to a source of the second column selection transistor. The first read bit line is connected to a source of the first read-only transfer transistor. The column selection line is connected to a gate of the first column selection transistor and a gate of the second column selection transistor.

First Embodiment

Figure 1:
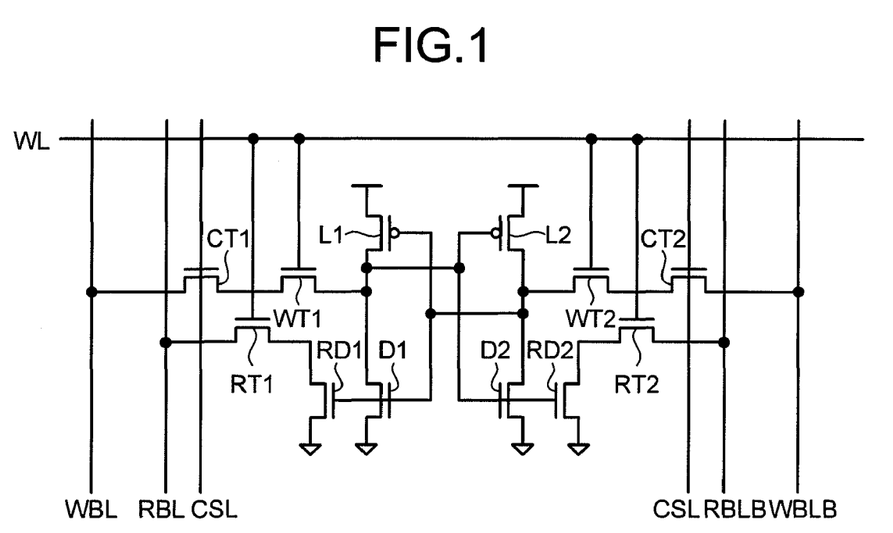
FIG. 1 is a circuit diagram of a general configuration of a semiconductor storage device according to a first embodiment of the present invention.

FIG. 1 is a circuit diagram of a general configuration of a semiconductor storage device according to a first embodiment of the present invention.

In FIG. 1, a memory cell of a static random access memory (SRAM) that is used as a semiconductor storage device includes a pair of drive transistors D1 and D2, a pair of load transistors L1 and L2, a pair of write-only transfer transistors WT1 and WT2, a pair of read-only transfer transistors RT1 and RT2, a pair of read-only drive transistors RD1 and RD2, and a pair of column selection transistors CT1 and CT2.

Each of the load transistors L1 and L2 can be formed of a P-channel field effect transistor. Each of the drive transistors D1 and D2, the write-only transfer transistors WT1 and WT2, the read-only transfer transistors RT1 and RT2, the read-only drive transistors RD1 and RD2, and the pair of the column selection transistors CT1 and CT2 can be formed of an N-channel field effect transistor.

The memory cell also includes a word line WL, a pair of write bit lines WBL and WBLB, a pair of read bit lines RBL and RBLB, and a column selection line CSL. The write bit lines WBL and WBLB, the read bit lines RBL and RBLB, and the column selection line CSL are arranged parallel to one another. The word line WL is arranged perpendicular to the write bit lines WBL and WBLB, the read bit lines RBL and RBLB, and the column selection line CSL.

The drive transistor D1 and the load transistor L1 are connected in series, so that a complementary metal-oxide semiconductor (CMOS) inverter is formed. The drive transistor D2 and the load transistor L2 are connected in series, so that another CMOS inverter is formed. An output of one of a pair of the CMOS inverters and an input of the other one of the pair of the CMOS inverters are cross coupled with each other, so that a flip-flop is formed.

To a drain of the write-only transfer transistor WT1 are connected a gate of the drive transistor D2, a gate of the load transistor L2, a drain of the drive transistor D1, and a drain of the load transistor L1.

To a drain of the write-only transfer transistor WT2 are connected a drain of the drive transistor D2, a drain of the load transistor L2, a gate of the drive transistor D1, and a gate of the load transistor L1.

To a gate of the read-only drive transistor RD1 are connected the gate of the drive transistor D1, the gate of the load transistor L1, the drain of the drive transistor D2, and the drain of the load transistor L2.

To a gate of the read-only drive transistor RD2 are connected the drain of the drive transistor D1, the drain of the load transistor L1, the gate of the drive transistor D2, and the gate of the load transistor L2.

To a drain of the read-only transfer transistor RT1 is connected a drain of the read-only drive transistor RD1. To a drain of the read-only transfer transistor RT2 is connected a drain of the read-only drive transistor RD2.

To a drain of the column selection transistor CT1 is connected a source of the write-only transfer transistor WT1. To a drain of the column selection transistor CT2 is connected a source of the write-only transfer transistor WT2.

To the word line WL are connected a gate of the write-only transfer transistor WT1, a gate of the write-only transfer transistor WT2, a gate of the read-only transfer transistor RT1, and a gate of the read-only transfer transistor RT2.

To the write bit line WBL is connected a source of the column selection transistor CT1. To the write bit line WBLB is connected a source of the column selection transistor CT2.

To the column selection line CSL are connected a gate of the column selection transistor CT1 and a gate of the column selection transistor CT2.

To the read bit line RBL is connected a source of the read-only transfer transistor RT1. To the read bit line RBLB is connected a source of the read-only transfer transistor RT2.

Described below is an operation of writing data into a selected cell in a memory cell array in which memory cells configured as shown in FIG. 1 are arranged in a row direction and a column direction in a matrix form.

When data is to be written into a selected cell, the selected cell is specified by a selected row and a selected column. Then, a potential of the word line WL corresponding to the selected row is set to a high level. A potential of each of the write bit lines WBL and WBLB corresponding to the selected column is set such that the potential of one of the write bit lines WBL and WBLB is set to a low level and the potential of the other one of the write bit lines WBL and WBLB is set to a high level, depending on the data to be written. A potential of the column selection line CSL corresponding to the selected column is set to a high level.

On the other hand, a potential of the word line WL corresponding to a non-selected row is set to a low level. A potential of each of the write bit lines WBL and WBLB corresponding to the non-selected column is set to a high level. A potential of the column selection line CSL corresponding to the non-selected column is set to a low level.

Potentials of all the read bit lines RBL and RBLB are respectively set to high levels regardless of the selected column and the non-selected column.

When the potential of the word line WL corresponding to the selected row and the potential of the column selection line CSL corresponding to the selected column are set to the high levels, the column selection transistors CT1 and CT2 and the write-only transfer transistors WT1 and WT2 in the selected cell are turned on, so that the potential of the write bit line WBL is applied to the drain of the drive transistor D1 and the drain of the load transistor L1, and the potential of the write bit line WBLB is applied to the drain of the drive transistor D2 and the drain of the load transistor L2.

At this time, either a logical value "0" or a logical value "1" is written into the selected cell depending on the potentials of the write bit lines WBL and WBLB.

On the other hand, the potential of the column selection line CSL corresponding to the non-selected column is set to the low level, so that the column selection transistors CT1 and CT2 in the non-selected cell that is connected to the word line WL corresponding to the selected row are turned off.

Therefore, in the non-selected cell that is connected to the word line WL corresponding to the selected row, the write bit line WBL is cut off from the drain of the drive transistor D1 and the drain of the load transistor L1, and the write bit line WBLB is cut off from the drain of the drive transistor D2 and the drain of the load transistor L2.

Furthermore, when the potential of the word line WL corresponding to the selected row is set to the high level, the read-only transfer transistors RT1 and RT2 in both the selected cell and the non-selected cell that are connected to the word line WL corresponding to the selected row are turned on. However, a source and a drain are not connected to each other between the read-only transfer transistor RT1 and the drive transistor D1, and a source and a drain are not connected to each other between the read-only transfer transistor RT2 and the drive transistor D2. Therefore, the potential of the read bit line RBL is applied to the drain of the read-only drive transistor RD1, and is thereby prevented from being applied to the drain of the drive transistor D1 and the drain of the load transistor L1. Furthermore, the potential of the read bit line RBLB is applied to the drain of the read-only drive transistor RD2, and is thereby prevented from being applied to the drain of the drive transistor D2 and the drain of the load transistor L2.

As a result, even when a memory cell having a small static noise margin is present, it is possible to prevent occurrence of write disturb, resulting in preventing corruption of data in both the selected cell and the non-selected cell.

Described next is an operation of reading data from a selected cell in a memory cell array in which the memory cells configured as shown in FIG. 1 are arranged in the row direction and the column direction in a matrix form.

When data is to be read out from a selected cell, the selected cell is specified by the selected row and the selected column. Then, a potential of the word line WL corresponding to the selected row, and a potential of each of the read bit lines RBL and RBLB corresponding to the selected column are set to high levels.

On the other hand, a potential of the word line WL corresponding to a non-selected row is set to a low level. A potential of each of the read bit lines RBL and RBLB corresponding to the non-selected cell is set to a high level.

Potentials of all the write bit lines WBL and WBLB are set to high levels regardless of the selected column and the non-selected column. Furthermore, potentials of all the column selection lines CSL are set to low levels regardless of the selected column and the non-selected column.

When the potential of the word line WL corresponding to the selected row is set to the high level, the read-only transfer transistors RT1 and RT2 in the selected cell are turned on, so that the read bit line RBL is electrically connected to the read-only drive transistor RD1, and the read bit line RBLB is electrically connected to the drain of the read-only drive transistor RD2. Then, the read-only drive transistor RD1 is driven according to the potential of the drain of the drive transistor D2 and the potential of the drain of the load transistor L2. Accordingly, the potential of the read bit line RBL changes according to the potential of the drain of the drive transistor D2 and the potential of drain of the load transistor L2, so that data stored in the selected cell is read out. Furthermore, the read-only drive transistor RD2 is driven according to the potential of the drain of the drive transistor D1 and the potential of the drain of the load transistor L1. Accordingly, the potential of the read bit line RBLB changes according to the potential of the drain of the drive transistor D1 and the potential of the drain of the load transistor L1, so that data stored in the selected cell is read out.

Furthermore, when the potential of the word line WL corresponding to the selected row is set to the high level, the read-only transfer transistors RT1 and RT2 in a non-selected cell that is connected to the word line WL corresponding to the selected row are turned on. However, the source and the drain are not connected to each other between the read-only transfer transistor RT1 and the drive transistor D1, and the source and the drain are not connected to each other between the read-only transfer transistor RT2 and the drive transistor D2. Therefore, the potential of the read bit line RBL is applied to the drain of the read-only drive transistor RD1, and is thereby prevented from being applied to the drain of the drive transistor D1 and the drain of the load transistor L1. Furthermore, the potential of the read bit line RBLB is applied to the drain of the read-only drive transistor RD2, and is thereby prevented from being applied to the drain of the drive transistor D2 and the drain of the load transistor L2.

Moreover, at the same time, the write-only transfer transistors WT1 and WT2 in the non-selected cell that is connected to the word line WL corresponding to the selected row are turned on. However, because the potentials of all the column selection lines CSL are set to the low levels regardless of the selected column and the non-selected column, the column selection transistors CT1 and CT2 in all the memory cells are turned off regardless of the selected cell and the non-selected cell.

Therefore, the write bit line WBL in every memory cell is cut off from the drain of the drive transistor D1 and the load transistor L1, and the write bit line WBLB in every memory cell is cut off from the drain of the drive transistor D2 and the drain of the load transistor L2.

As a result, even when a memory cell having a small static noise margin is present, it is possible to prevent occurrence of read disturb, resulting in preventing corruption of data in both the selected cell and the non-selected cell.

Second Embodiment

In FIG. 1, when data is to be written into the memory cell, it is possible to set the potential of a write bit line into which the logical value "0" is to be written between the write bit lines WBL and WBLB to a negative value. Consequently, it is possible to prevent degradation of write performance even when a source voltage is set to a low voltage.

Third Embodiment

In FIG. 1, it is possible to set a threshold voltage of each of the column selection transistors CT1 and CT2 to be smaller than a threshold voltage of corresponding one of the write-only transfer transistors WT1 and WT2. Consequently, even when a source voltage is set to a low voltage, it is possible to prevent degradation of write performance and increase in leak current, resulting in preventing increase in power consumption.

Furthermore, in FIG. 1, it is possible to set a threshold voltage of each of the read-only drive transistors RD1 and RD2 to be smaller than a threshold voltage of corresponding one of the read-only transfer transistors RT1 and RT2. Consequently, it is possible to prevent increase in leak current. Moreover, if the potential of the word line WL is increased at the time of selection, cell current can be increased, so that it is possible to increase read speed while preventing increase in power consumption.

Fourth Embodiment

Figure 2:
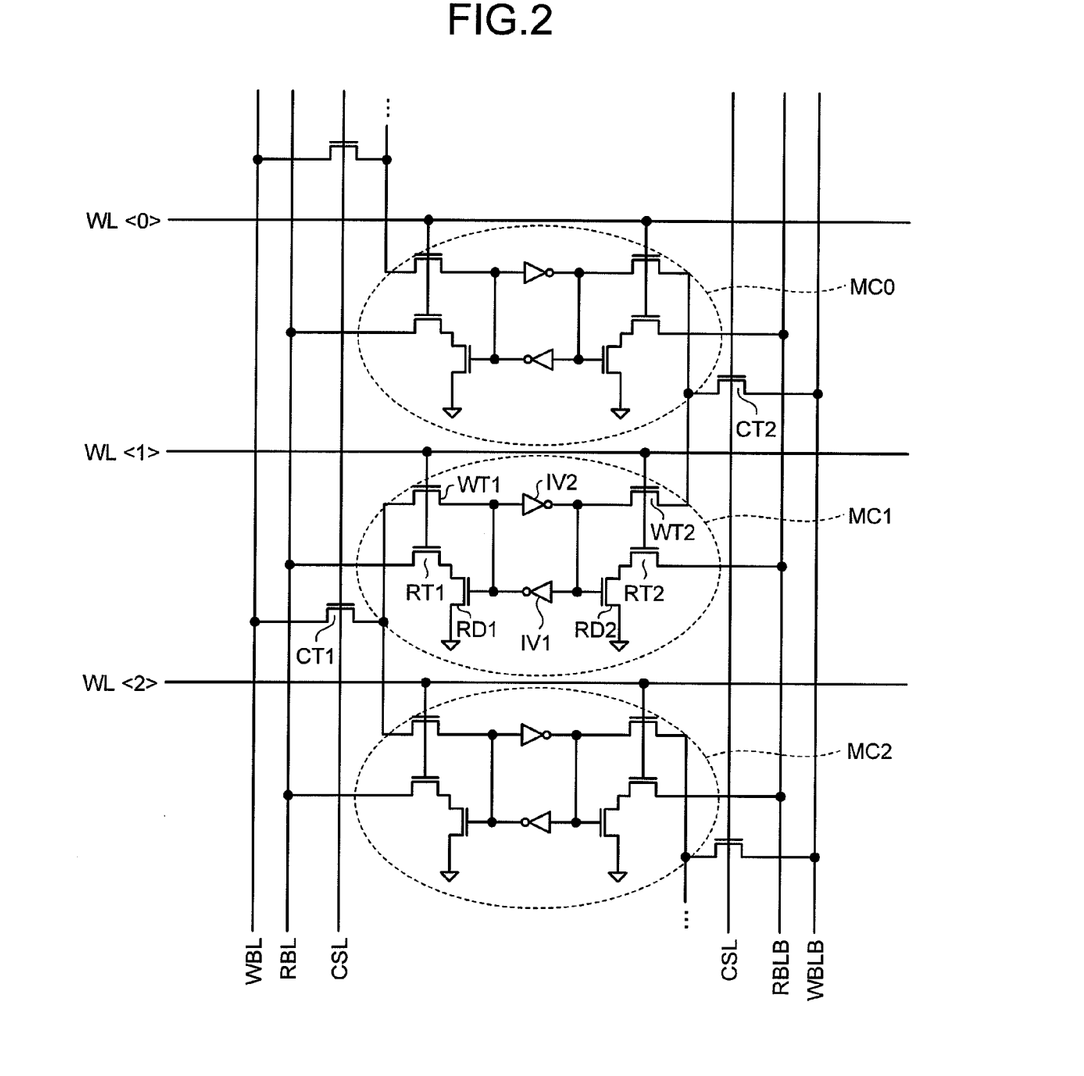
FIG. 2 is a circuit diagram of a general configuration of a semiconductor storage device according to a fourth embodiment of the present invention.

FIG. 2 is a circuit diagram of a general configuration of a semiconductor storage device according to a fourth embodiment of the present invention.

In FIG. 2, it is assumed that memory cells MC0 to MC2 are arranged in a column direction in a memory cell array.

In the memory cell MC1 are arranged inverters IV1 and IV2, a pair of the write-only transfer transistors WT1 and WT2, a pair of the read-only transfer transistors RT1 and RT2, and a pair of the read-only drive transistors RD1 and RD2. The inverters IV1 and IV2 can respectively be formed of the drive transistors D1 and D2 as a pair and the load transistors L1 and L2 as a pair, which are shown in FIG. 1. Each of the memory cells MC0 and MC2 can be configured in the same manner as the memory cell MC1.

Word lines WL<0> to WL<2> corresponding to the memory cells MC0 to MC2, respectively, are arranged in a row direction. A pair of the write bit lines WBL and WBLB, a pair of the read bit lines RBL and RBLB, and the column selection line CSL are arranged in the column direction such that they are shared by the memory cells MC0 to MC2.

The column selection transistor CT1 is arranged so as to be shared by the memory cells MC1 and MC2 that are adjacent to each other. The column selection transistor CT2 is arranged so as to be shared by the memory cells MC0 and MC1 that are adjacent to each other. When the column selection transistors CT1 and CT2 are shared among the memory cells MC0 to MC2, it is preferable to arrange the column selection transistor CT1 so as to be shared by the memory cells MC1 and MC0 that are adjacent to each other on one side of the memory cell MC1, and arrange the column selection transistor CT2 so as to be shared by the memory cells MC1 and MC2 that are adjacent to each other on the other side of the memory cell MC1 so that symmetric layout can be assured.

More specifically, the drain of the column selection transistor CT1 is commonly connected to the source of the write-only transfer transistor WT1 of each of the memory cells MC1 and MC2, the source of the column selection transistor CT1 is connected to the write bit line WBL, and the gate of the column selection transistor CT1 is connected to the column selection line CSL. Furthermore, the drain of the column selection transistor CT2 is commonly connected to the source of the write-only transfer transistor WT2 of each of the memory cells MC0 and MC1, the source of the column selection transistor CT2 is connected to the write bit line WBLB, and the gate of the column selection transistor CT2 is connected to the column selection line CSL.

Consequently, an area of each of the column selection transistors CT1 and CT2 per memory cell can be doubled without increasing the area of the memory cell. Therefore, driving power of each of the column selection transistors CT1 and CT2 can be increased without increasing the area of the memory cell. As a result, even when the column selection transistors CT1 and CT2 are respectively connected to the write-only transfer transistors WT1 and WT2 in series, it is possible to prevent decrease in write speed.

Fifth Embodiment

Figure 3:
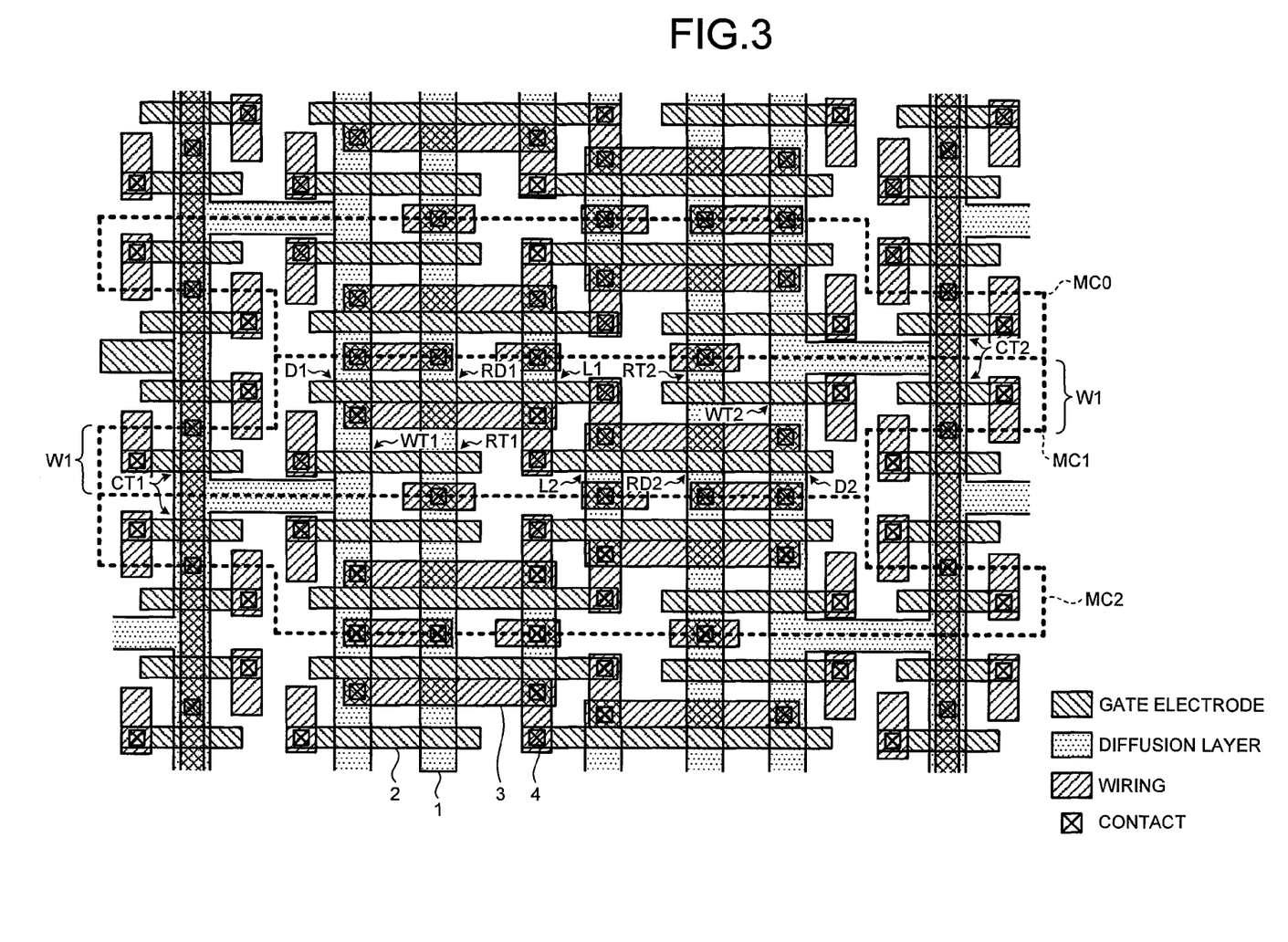
FIG. 3 is a diagram illustrating a layout structure of a semiconductor storage device according to a fifth embodiment of the present invention.

FIG. 3 is a diagram illustrating a layout structure of a semiconductor storage device according to a fifth embodiment of the present invention.

In FIG. 3, diffusion layers 1 are formed on a semiconductor substrate. Gate electrodes 2 are arranged between the diffusion layers 1, so that a pair of the drive transistors D1 and D2, a pair of the load transistors L1 and L2, a pair of the write-only transfer transistors WT1 and WT2, a pair of the read-only transfer transistors RT1 and RT2, and a pair of the read-only drive transistors RD1 and RD2, and a pair of the column selection transistors CT1 and CT2, which are shown in FIG. 1, are formed.

Contacts 4 connected to wirings 3 are formed on the diffusion layers 1 and the gate electrodes 2. The diffusion layers 1 and the gate electrodes 2 are connected to one another via the wirings 3, so that the transistors are wired to one another as illustrated in FIG. 1.

In FIG. 3, each of the memory cells MC0 to MC2 is laid out so as to be symmetric with respect to a point. The column selection transistors CT1 and CT2 are arranged such that they are located at diagonal positions of each of the memory cells MC0 to MC2 and respective widths W1 in the column direction become equal to each other. The memory cells MC0 to MC2 are arranged such that they are alternately inverted in the column direction. Memory cells adjacent to the memory cells MC0 to MC2 in the row direction are laid out in the same orientation.

The write bit line WBL arranged on one side of each of the memory cells MC0 to MC2 is shared as the write bit line WBLB arranged on the other side of each of memory cells that are adjacent to the one sides of the memory cells MC0 to MC2. Furthermore, the write bit line WBLB arranged on the other side of each of the memory cells MC0 to MC2 is shared as the write bit line WBL arranged on one side of each of memory cells that are adjacent to the other sides of the memory cells MC0 to MC2.

The memory cells MC0 to MC2 are arranged such that they are alternately inverted in the column direction, so that the contacts 4 connected to a power wire, the write bit lines WBL and WBLB, and the read bit lines RBL and RBLB can be shared, at boundaries among the memory cells MC0 to MC2, by the memory cells MC0 to MC2 that are adjacent to each other in the column direction. As a result, the area of the memory cell can be reduced.

Furthermore, the column selection transistors CT1 and CT2 are arranged such that they are located at diagonal positions of each of the memory cells MC0 to MC2, so that the respective column selection transistors CT1 of the memory cells MC1 and MC2 can be arranged adjacent to each other and the respective column selection transistors CT2 of the memory cells MC0 and MC1 can be arranged adjacent to each other. Therefore, the respective column selection transistors CT1 of the memory cells MC1 and MC2 can be shared by the memory cells MC1 and MC2, and the respective column selection transistors CT2 of the memory cells MC0 and MC1 can be shared by the memory cells MC0 and MC1. As a result, the driving power of each of the column selection transistors CT1 and CT2 can be increased without increasing the area of the memory cell.

Sixth Embodiment

Figure 4:
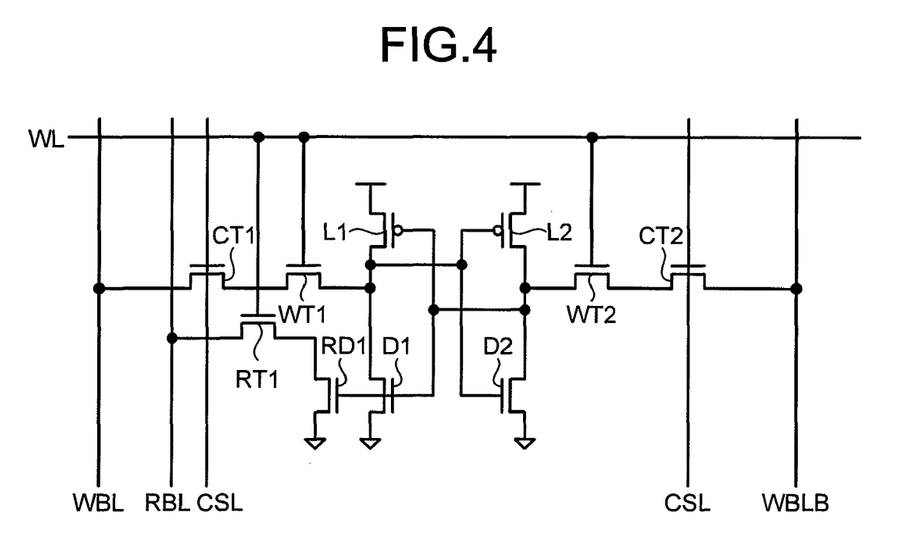
FIG. 4 is a circuit diagram of a general configuration of a semiconductor storage device according to a sixth embodiment of the present invention.

FIG. 4 is a circuit diagram of a general configuration of a semiconductor storage device according to a sixth embodiment of the present invention.

In FIG. 4, in a memory cell, the read-only transfer transistor RT2, the read-only drive transistor RD2, and the read bit line RBLB are omitted from the configuration shown in FIG. 1.

When performing writing to the memory cell, the same operation as the memory cell shown in FIG. 1 can be applied. While data is read out via the pair of the read bit lines RBL and RBLB in this memory cell, data is read out via the single read bit line RBL in the memory cell of the present embodiment.

Consequently, even when a static noise margin is small, it is possible to prevent occurrence of write disturb and read disturb while coping with one side reading.

Seventh Embodiment

Figure 5:
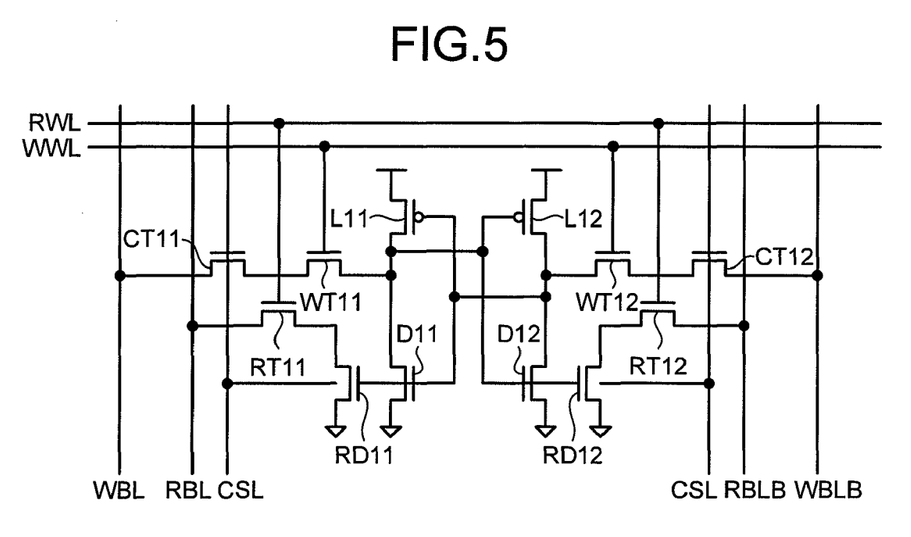
FIG. 5 is a circuit diagram of a general configuration of a semiconductor storage device according to a seventh embodiment of the present invention.

FIG. 5 is a circuit diagram of a general configuration of a semiconductor storage device according to a seventh embodiment of the present invention.

In FIG. 5, a memory cell of an SRAM that is used as a semiconductor storage device includes a pair of drive transistors D11 and D12, a pair of load transistors L11 and L12, a pair of write-only transfer transistors WT11 and WT12, a pair of read-only transfer transistors RT11 and RT12, a pair of read-only drive transistors RD11 and RD12, and a pair of column selection transistors CT11 and CT12.

Each of the load transistors L11 and L12 can be formed of a P-channel field effect transistor. Each of the drive transistors D11 and D12, the write-only transfer transistors WT11 and WT12, the read-only transfer transistors RT11 and RT12, the read-only drive transistors RD11 and RD12, and the column selection transistors CT11 and CT12 can be formed of an N-channel field effect transistor.

Each of the read-only drive transistors RD11 and RD12 should preferably be formed of a double-gate fin transistor in which a front gate and a back gate are arranged opposite to each other. Furthermore, each of the drive transistors D11 and D12, the load transistors L11 and L12, the write-only transfer transistors WT11 and WT12, the read-only transfer transistors RT11 and RT12, and the column selection transistors CT11 and CT12 should preferably be formed of a double-gate fin transistor with a shared gate.

The memory cell also includes a word line WWL, a read word line RWL, a pair of the write bit lines WBL and WBLB, a pair of the read bit lines RBL and RBLB, and the column selection line CSL. The write bit lines WBL and WBLB, the read bit lines RBL and RBLB, and the column selection line CSL can be arranged parallel to one another. The word line WWL and the read word line RWL can be arranged parallel to each other. The word line WWL and the read word line RWL can also be arranged perpendicular to the write bit lines WBL and WBLB, the read bit lines RBL and RBLB, and the column selection line CSL.

The drive transistor D11 and the load transistor L11 are connected in series, so that a CMOS inverter is formed. The drive transistor D12 and the load transistor L12 are connected in series, so that another CMOS inverter is formed. An input of one of a pair of the CMOS inverters and on output of the other one of the pair of the CMOS inverters are cross coupled with each other, so that a flip-flop is formed.

To a drain of the write-only transfer transistor WT11 are connected a gate of the drive transistor D12, a gate of the load transistor L12, a drain of the drive transistor D11, and a drain of the load transistor L11.

To a drain of the write-only transfer transistor WT12 are connected a drain of the drive transistor D12, a drain of the load transistor L12, a gate of the drive transistor D11, and a gate of the load transistor L11.

To a front gate of the read-only drive transistor RD11 are connected the gate of the drive transistor D11, the gate of the load transistor L11, the drain of the drive transistor D12, and the drain of the load transistor L12.

To a front gate of the read-only drive transistor RD12 are connected the drain of the drive transistor D11, the drain of the load transistor L11, the gate of the drive transistor D12, and the gate of the load transistor L12.

To a drain of the read-only transfer transistor RT11 is connected a drain of the read-only drive transistor RD11. To a drain of the read-only transfer transistor RT12 is connected a drain of the read-only drive transistor RD12.

To a drain of the column selection transistor CT11 is connected a source of the write-only transfer transistor WT11. To a drain of the column selection transistor CT12 is connected a source of the write-only transfer transistor WT12.

To the word line WWL are connected a gate of the write-only transfer transistor WT11 and a gate of the write-only transfer transistor WT12. To the read word line RWL are connected a gate of the read-only transfer transistor RT11 and a gate of the read-only transfer transistor RT12.

To the write bit line WBL is connected a source of the column selection transistor CT11. To the write bit line WBLB is connected a source of the column selection transistor CT12. To the column selection line CSL are connected a gate of the column selection transistor CT11, a gate of the column selection transistor CT12, a back gate of the read-only drive transistor RD11, and a back gate of the read-only drive transistor RD12.

To the read bit line RBL is connected a source of the read-only transfer transistor RT11. To the read bit line RBLB is connected a source of the read-only transfer transistor RT12.

Described below is an operation of writing data into a selected cell in a memory cell array in which memory cells configured as shown in FIG. 5 are arranged in the row direction and the column direction in a matrix form.

When data is to be written into a selected cell, the selected cell is specified by a selected row and a selected column. Then, a potential of the word line WWL corresponding to the selected row is set to a high level. A potential of each of the write bit lines WBL and WBLB corresponding to the selected column is set such that the potential of one of the write bit lines WBL and WBLB is set to a low level and the potential of the other one of the write bit lines WBL and WBLB is set to a high level, depending on the data to be written. A potential of the column selection line CSL corresponding to the selected column is set to a high level.

On the other hand, a potential of the word line WWL corresponding to a non-selected row is set to a low level. A potential of each of the write bit lines WBL and WBLB corresponding to the non-selected column is set to a high level. A potential of the column selection line CSL corresponding to the non-selected column is set to a low level.

Potentials of all the read bit lines RBL and RBLB are set to high levels regardless of the selected column and the non-selected column. Furthermore, potentials of all the read word lines RWL are set to low levels regardless of the selected row and the non-selected row.

When the potential of the word line WWL corresponding to the selected row and the potential of the column selection line CSL corresponding to the selected column are set to the high levels, the column selection transistors CT11 and CT12 and the write-only transfer transistors WT11 and WT12 in the selected cell are turned on. Then, the potential of the write bit line WBL is applied to the drain of the drive transistor D11 and the drain of the load transistor L11, and the potential of the write bit line WBLB is applied to the drain of the drive transistor D12 and the drain of the load transistor L12.

At this time, either the logical value "0" or the logical value "1" is written into the selected cell depending on the potentials of the write bit lines WBL and WBLB.

On the other hand, the potential of the column selection line CSL corresponding to the non-selected column is set to the low level, so that the column selection transistors CT11 and CT12 in the non-selected cell that is connected to the word line WWL corresponding to the selected row are turned off.

Therefore, in the non-selected cell that is connected to the word line WWL corresponding to the selected row, the write bit line WBL is cut off from the drain of the drive transistor D11 and the load transistor L11, and the write bit line WBLB is cut off from the drain of the drive transistor D12 and the drain of the load transistor L12.

Furthermore, even when the potential of the word line WWL corresponding to the selected row is set to the high level, the read-only transfer transistors RT11 and RT12 in both the selected cell and the non-selected cell are turned off by setting the potential of the read word line RWL corresponding to the selected row to a low level. Besides, a source and a drain are not connected to each other between the read-only transfer transistor RT11 and the drive transistor D11, and a source and a drain are not connected to each other between the read-only transfer transistor RT12 and the drive transistor D12. Therefore, it is possible to prevent the potential of the read bit line RBL from being applied to the drain of the drive transistor D11 and the drain of the load transistor L11. It is also possible to prevent the potential of the read bit line RBLB from being applied to the drain of the drive transistor D12 and the drain of the load transistor L12. As a result, even when a memory cell having a small static noise margin is present, it is possible to prevent occurrence of write disturb, resulting in preventing corruption of data in both the selected cell and the non-selected cell.

Described next is an operation of reading data from a selected cell in a memory cell array in which the memory cells configured as shown in FIG. 5 are arranged in the row direction and the column direction in a matrix form.

When data is to be read out from a selected cell, the selected cell is specified by the selected row and the selected column. Then, a potential of the read word line RWL corresponding to the selected row, a potential of each of the read bit lines RBL and RBLB corresponding to the selected column, and a potential of the column selection line CSL corresponding to the selected column are set to high levels.

On the other hand, a potential of the read word line RWL corresponding to a non-selected row, and a potential of the column selection line CSL corresponding to the non-selected column are set to low levels. Furthermore, a potential of each of the read bit lines RBL and RBLB corresponding to the non-selected columns are set to the high levels.

Potentials of all the write bit lines WBL and WBLB are respectively set to high levels regardless of the selected column and the non-selected column. Furthermore, potentials of all the word lines WWL are respectively set to low levels regardless of the selected row and the non-selected row.

When the potential of the read word line RWL corresponding to the selected row is set to the high level, the read-only transfer transistors RT11 and RT12 in the selected cell are turned on, so that the read bit line RBL is electrically connected to the read-only drive transistor RD11, and the read bit line RBLB is electrically connected to the drain of the read-only drive transistor RD12. Then, the read-only drive transistor RD11 is driven according to the potential of the drain of the drive transistor D12 and the potential of the drain of the load transistor L12. Accordingly, the potential of the read bit line RBL changes according to the potential of the drain of the drive transistor D12 and the potential of the drain of the load transistor L12, so that data stored in the selected cell is read out. Furthermore, the read-only drive transistor RD12 is driven according to the potential of the drain of the drive transistor D11 and the potential of the drain of the load transistor L11. Accordingly, the potential of the read bit line RBLB changes according to the potential of the drain of the drive transistor D11 and the potential of the drain of the load transistor L11, so that data stored in the selected cell is read out.

When data is to be read out from the selected cell, the potential of the column selection line CSL corresponding to the selected column is set to the high level, and the high level is applied to the back gate of each of the read-only drive transistors RD11 and RD12 in the selected cell, so that a threshold voltage of each of the read-only drive transistors RD11 and RD12 in the selected cell decreases. Therefore, it is possible to increase cell current of each of the read-only drive transistors RD11 and RD12 in the selected cell, resulting in increased read speed for the selected cell.

Furthermore, when the potential of the read word line RWL corresponding to the selected row is set to the high level, the read-only transfer transistors RT11 and RT12 in the non-selected cell that is connected to the read word line RWL corresponding to the selected row are turned on. However, the source and the drain are not connected to each other between the read-only transfer transistor RT11 and the drive transistor D11, and the source and the drain are not connected to each other between the read-only transfer transistor RT12 and the drive transistor D12. Therefore, the potential of the read bit line RBL is applied to the drain of the read-only drive transistor RD11, and is thereby prevented from being applied to the drain of the drive transistor D11 and the drain of the load transistor L11. Furthermore, the potential of the read bit line RBLB is applied to the drain of the read-only drive transistor RD12, and is thereby prevented from being applied to the drain of the drive transistor D12 and the drain of the load transistor L12.

Besides, when data is to be read out from the selected cell, the potential of the column selection line CSL corresponding to the non-selected column is set to the low level. Accordingly, the low level is applied to the back gate of each of the read-only drive transistors RD11 and RD12 in the non-selected cell, so that a threshold voltage of each of the read-only drive transistors RD11 and RD12 in the non-selected cell increases. Therefore, it is possible to decrease cell current of each of the read-only drive transistors RD11 and RD12 in the non-selected cell, resulting in decreased power consumption.

Even when the potential of the read word line RWL corresponding to the selected row is set to the high level, the write-only transfer transistors WT11 and WT12 in both the selected cell and the non-selected cell are turned off by setting the potential of the word line WWL corresponding to the selected row to a low level. Therefore, the write bit line WBL in both the selected cell and the non-selected cell can be cut off from the drain of the drive transistor D11 and the load transistor L11, and the write bit line WBLB in both the selected cell and the non-selected cell can be cut off from the drain of the drive transistor D12 and the drain of the load transistor L12.

As a result, even when a memory cell having a small static noise margin is present, it is possible to prevent read disturb that may occur because of the potential of each of the write bit lines WBL and WBLB, resulting in preventing corruption of data in both the selected cell and the non-selected cell.

Eighth Embodiment

In FIG. 5, when data is to be written into the memory cell, it is possible to set the potential of a write bit line into which the logical value "0" is to be written between the write bit lines WBL and WBLB to a negative value. Consequently, it is possible to prevent degradation of write performance even when a source voltage is set to a low voltage.

Ninth Embodiment

In FIG. 5, it is possible to set a threshold voltage of each of the column selection transistors CT11 and CT12 to be smaller than a threshold voltage of a corresponding one of the write-only transfer transistors WT11 and WT1. Consequently, even when a source voltage is set to a low voltage, it is possible to prevent degradation of write performance and increase in leak current, resulting in preventing increase in consumption current.

Furthermore, in FIG. 5, it is possible to set a threshold voltage of each of the read-only drive transistors RD11 and RD12 to be smaller than a threshold voltage of a corresponding one of the read-only transfer transistors RT11 and RT12. Consequently, it is possible to prevent increase in leak current. Moreover, if the potential of the read word line RWL is increased at the time of selection, cell current can be increased, so that it is possible to increase read speed while preventing increase in consumption current.

Tenth Embodiment

Figure 6:
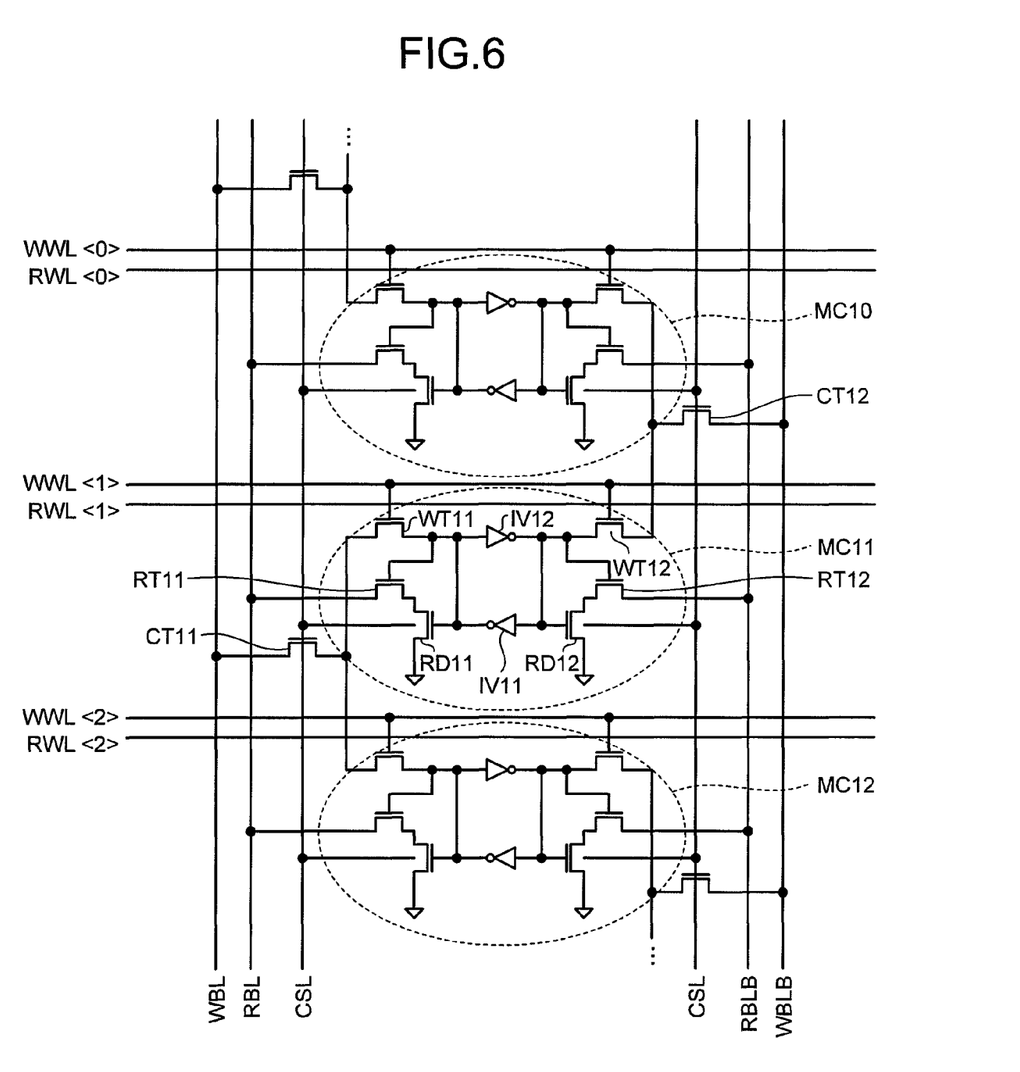
FIG. 6 is a circuit diagram of a general configuration of a semiconductor storage device according to a tenth embodiment of the present invention.

FIG. 6 is a circuit diagram of a general configuration of a semiconductor storage device according to a tenth embodiment of the present invention.

In FIG. 6, it is assumed that memory cells MC10 to MC12 are arranged in the column direction in a memory cell array.

In the memory cell MC11, for example, are arranged inverters IV11 and IV12, a pair of the write-only transfer transistors WT11 and WT12, a pair of the read-only transfer transistors RT11 and RT12, and a pair of the read-only drive transistors RD11 and RD12. The inverters IV11 and IV12 can respectively be formed of the drive transistors D11 and D12 as a pair and the load transistors L11 and L12 as a pair, which are shown in FIG. 5. Each of the memory cells MC10 and MC12 can be configured in the same manner as the memory cell MC11.

Write word lines WWL<0> to WWL<2> and read word lines RWL<0> to RWL<2> corresponding to memory cells MC10 to MC12, respectively, are arranged in the row direction. A pair of the write bit lines WBL and WBLB, a pair of the read bit lines RBL and RBLB, and the column selection line CSL are arranged in the column direction such that they are shared by the memory cells MC10 to MC12.

The column selection transistor CT11 is arranged so as to be shared by the memory cells MC11 and MC12 that are adjacent to each other. The column selection transistor CT12 is arranged so as to be shared by the memory cells MC10 and MC11 that are adjacent to each other. When the column selection transistors CT11 and CT12 are shared among the memory cells MC10 to MC12, it is preferable to arrange the column selection transistor CT11 so as to be shared by the memory cells MC11 and MC10 that are adjacent to each other on one side of the memory cell MC11, and arrange the column selection transistor CT12 so as to be shared by the memory cells MC11 and MC12 that are adjacent to each other on the other side of the memory cell MC11 so that symmetric layout can be assured.

More specifically, the drain of the column selection transistor CT11 is commonly connected to the source of the write-only transfer transistor WT11 of each of the memory cells MC11 and MC12, the source of the column selection transistor CT11 is connected to the write bit line WBL, and the gate of the column selection transistor CT11 is connected to both the column selection line CSL and the back gate of the read-only drive transistor RD11. Furthermore, the drain of the column selection transistor CT12 is commonly connected to the source of the write-only transfer transistor WT12 of each of the memory cells MC10 and MC11, the source of the column selection transistor CT12 is connected to the write bit line WBLB, and the gate of the column selection transistor CT12 is connected to both the column selection line CSL and the back gate of the read-only drive transistor RD12.

Consequently, an area of each of the column selection transistors CT11 and CT12 per memory cell can be doubled without increasing the area of the memory cell. Therefore, driving power of each of the column selection transistors CT11 and CT12 can be increased without increasing the area of the memory cell. As a result, even when the column selection transistors CT11 and CT12 are respectively connected to the write-only transfer transistors WT11 and WT12 in series, it is possible to prevent decrease in write speed.

Eleventh Embodiment

Figure 7:
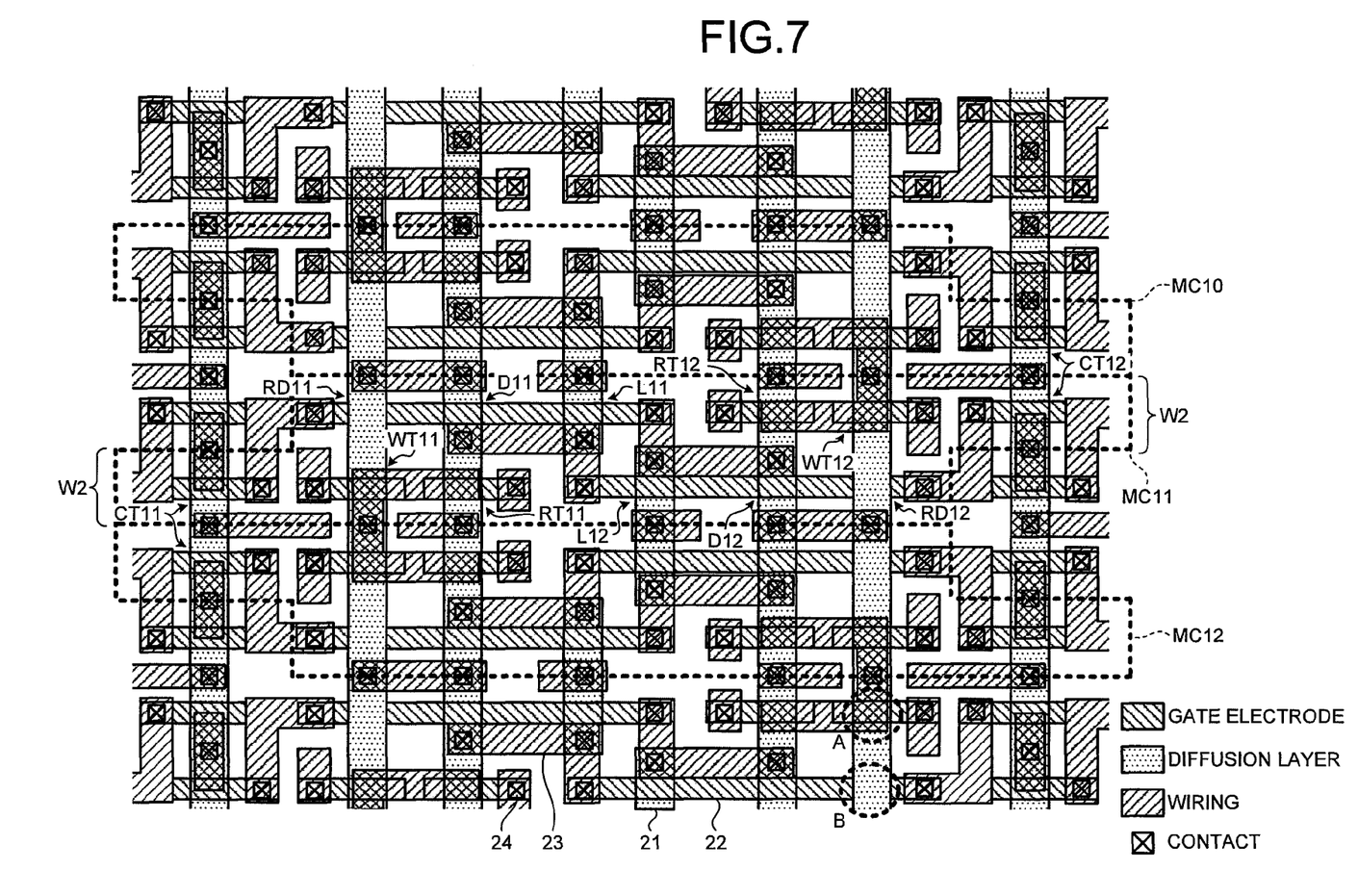
FIG. 7 is a diagram illustrating a layout structure of a semiconductor storage device according to an eleventh embodiment of the present invention.

FIG. 7 is a diagram illustrating a layout structure of a semiconductor storage device according to an eleventh embodiment of the present invention.

In FIG. 7, diffusion layers 21 are formed on a semiconductor substrate. Gate electrodes 22 are arranged between the diffusion layers 21, so that a pair of the drive transistors D11 and D12, a pair of the load transistors L11 and L12, a pair of the write-only transfer transistors WT11 and WT12, a pair of the read-only transfer transistors RT11 and RT12, a pair of the read-only drive transistors RD11 and RD12, and a pair of the column selection transistors CT11 and CT12, which are shown in FIG. 5, are formed.

Contacts 24 connected to wirings 23 are formed on the diffusion layers 21 and the gate electrodes 22. The diffusion layers 21 and the gate electrodes 22 are connected to one another via the wirings 23, so that the transistors are wired to one another as shown in FIG. 5.

In FIG. 7, each of the memory cells MC10 to MC12 is laid out so as to be symmetric with respect to a point. The column selection transistors CT11 and CT12 are arranged such that they are located at diagonal positions of each of the memory cells MC10 to MC12 and respective widths W2 in the column direction become equal to each other. The memory cells MC10 to MC12 are arranged such that they are alternately inverted in the column direction. Memory cells adjacent to the memory cells MC10 to MC12 in the row direction are laid out in the same orientation.

The write bit line WBL arranged on one side of each of the memory cells MC10 to MC12 is shared as the write bit line WBLB arranged on the other side of each of memory cells that are adjacent to the one sides of the memory cells MC10 to MC12. Furthermore, the write bit line WBLB arranged on the other side of each of the memory cells MC10 to MC12 is shared as the write bit line WBL arranged on one side of each of the memory cells that are adjacent to the other sides of the memory cells MC10 to MC12.

The memory cells MC10 to MC12 are arranged such that they are alternately inverted in the column direction, so that the contacts 24 connected to a power wire, the write bit lines WBL and WBLB, and the read bit lines RBL and RBLB can be shared, at boundaries among the memory cells MC10 to MC12, by the memory cells MC10 to MC12 that are adjacent to each other in the column direction. As a result, the area of the memory cell can be reduced.

Furthermore, the column selection transistors CT11 and CT12 are arranged such that they are located at diagonal positions of each of the memory cells MC10 to MC12, so that the respective column selection transistors CT11 of the memory cells MC11 and MC12 can be arranged adjacent to each other and the respective column selection transistors CT12 of the memory cells MC10 and MC11 can be arranged adjacent to each other. Therefore, the respective column selection transistors CT11 of the memory cells MC11 and MC12 can be shared by the memory cells MC11 and MC12, and the respective column selection transistors CT12 of the memory cells MC10 and MC11 can be shared by the memory cells MC10 and MC11. As a result, the driving power of each of the column selection transistors CT11 and CT12 can be increased without increasing the area of the memory cell.

Figure 8A:
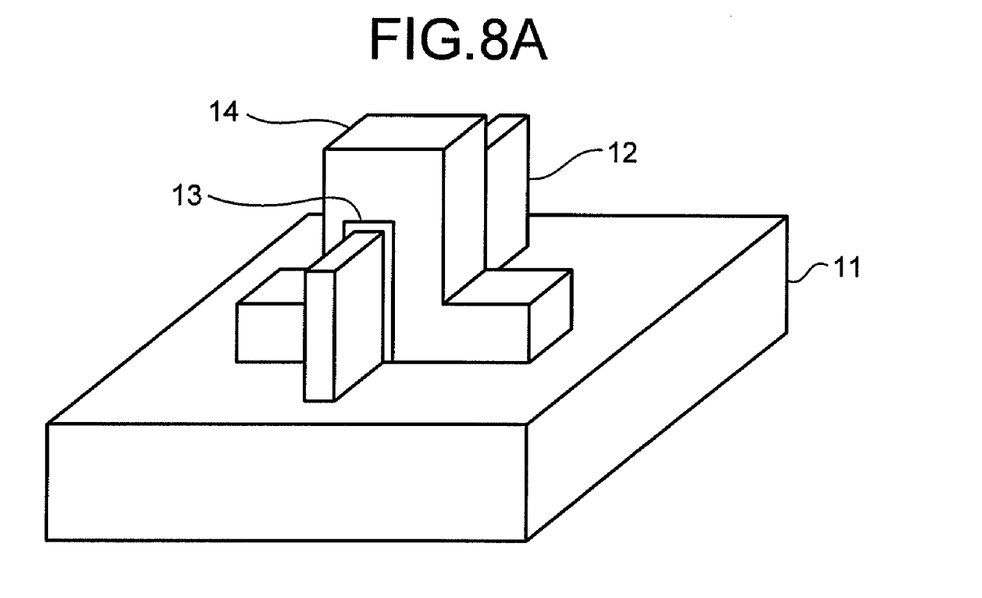
FIGS. 8A and 8B are perspective views of a general configuration of a fin transistor used in the semiconductor storage device shown in FIG. 7.
Figure 8B:
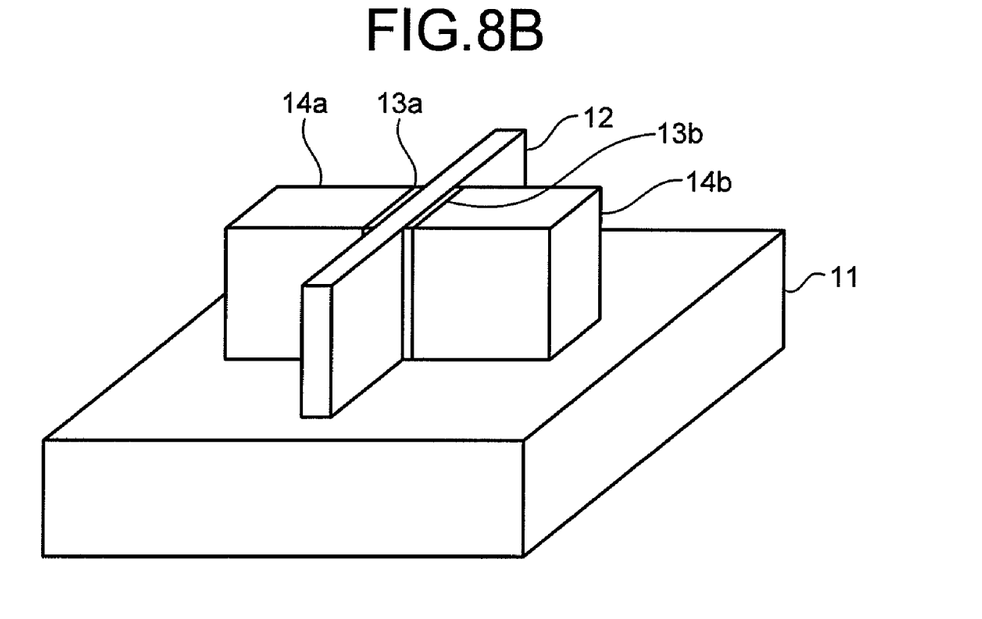

FIGS. 8A and 8B are perspective views of a general configuration of a fin transistor used in the semiconductor storage device shown in FIG. 7. FIG. 8A illustrates a configuration example of a portion A shown in FIG. 7. FIG. 8B illustrates a configuration example of a portion B shown in FIG. 7.

In FIG. 8A, a fin 12 formed of a semiconductor is formed on a BOX layer 11. A gate electrode 14 is formed on both side surfaces of the fin 12 via a gate insulating film 13 on the BOX layer 11 such that the gate electrode 14 straddles the fin 12. The gate electrode 14 can be used as the gate of each of the drive transistors D11 and D12, the load transistors L11 and L12, the write-only transfer transistors WT11 and WT12, the read-only transfer transistors RT11 and RT12, and the column selection transistors CT11 and CT12, which are shown in FIG. 5.

In FIG. 8B, the fin 12 formed of a semiconductor is formed on the BOX layer 11. Gate electrodes 14a and 14b are respectively formed on both side surfaces of the fin 12 via gate insulating films 13a and 13b on the BOX layer 11. The gate electrode 14a can be used as the front gate of each of the read-only drive transistors RD11 and RD12. The gate electrode 14b can be used as the back gate of each of the read-only drive transistors RD11 and RD12.

Twelfth Embodiment

Figure 9:
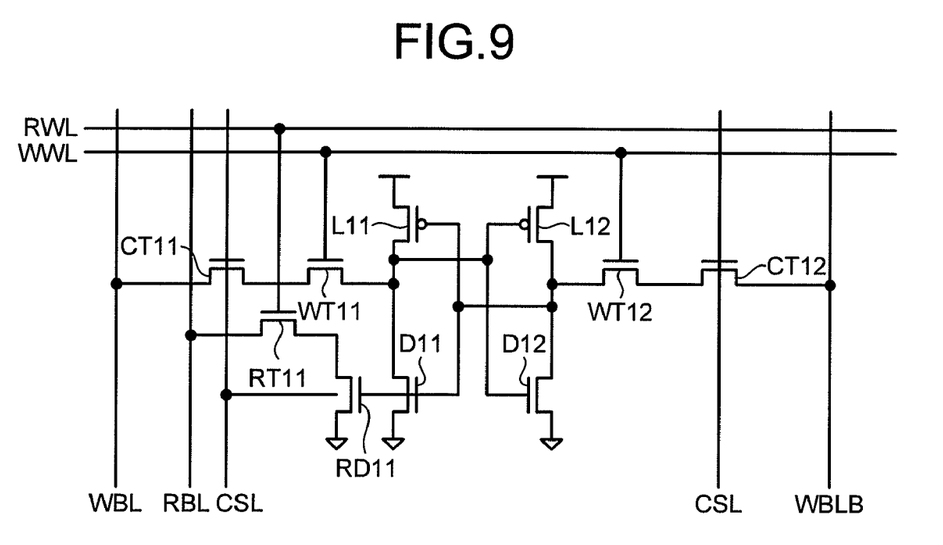
FIG. 9 is a circuit diagram of a general configuration of a semiconductor storage device according to a twelfth embodiment of the present invention.

FIG. 9 is a circuit diagram of a general configuration of a semiconductor storage device according to a twelfth embodiment of the present invention.

In FIG. 9, in a memory cell, the read-only transfer transistor RT12, the read-only drive transistor RD12, and the read bit line RBLB are omitted from the configuration shown in FIG. 5.

When performing writing to the memory cell, the same operation as the memory cell shown in FIG. 5 can be applied. While data is read out via the pair of the read bit line RBL and RBLB in the memory cell shown in FIG. 5, data is read out via a single read bit line RBL in the memory cell of the present embodiment.

Consequently, even when a static noise margin is small, it is possible to prevent occurrence of write disturb and read disturb while coping with one side reading.

In FIGS. 1 and 4, it is possible to arrange a dedicated word line similarly to that illustrated in FIGS. 5 and 9.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage device comprising a memory cell, wherein the memory cell comprises:
    a first drive transistor;
    a second drive transistor;
    a first load transistor connected to the first drive transistor in series;
    a second load transistor connected to the second drive transistor in series;
    a first write-only transfer transistor whose drain is connected to a gate of the second drive transistor, a gate of the second load transistor, a drain of the first drive transistor, and a drain of the first load transistor;
    a second write-only transfer transistor whose drain is connected to a drain of the second drive transistor, a drain of the second load transistor, a gate of the first drive transistor, and a gate of the first load transistor;
    a first read-only drive transistor whose gate is connected to the gate of the first drive transistor, the gate of the first load transistor, the drain of the second drive transistor, and the drain of the second load transistor;
    a first read-only transfer transistor whose drain is connected to a drain of the first read-only drive transistor;
    a first column selection transistor whose drain is connected to a source of the first write-only transfer transistor;
    a second column selection transistor whose drain is connected to a source of the second write-only transfer transistor;
    a word line connected to a gate of the first write-only transfer transistor, a gate of the second write-only transfer transistor, and a gate of the first read-only transfer transistor;
    a first write bit line connected to a source of the first column selection transistor;
    a second write bit line connected to a source of the second column selection transistor;
    a first read bit line connected to a source of the first read-only transfer transistor; and
    a column selection line connected to a gate of the first column selection transistor and a gate of the second column selection transistor.

2. The semiconductor storage device according to claim 1, further comprising:
    a second read-only drive transistor whose gate is connected to the drain of the first drive transistor, the drain of the first load transistor, the gate of the second drive transistor, and the gate of the second load transistor;
    a second read-only transfer transistor whose drain is connected to a drain of the second read-only drive transistor, and whose gate is connected to the word line; and
    a second read bit line connected to a source of the second read-only transfer transistor.

3. The semiconductor storage device according to claim 2, wherein when data is to be written into the memory cell, a potential of one of the first write bit line and the second write bit line, to which a logical value of zero is to be written, is set to a negative value.

4. The semiconductor storage device according to claim 2, wherein a threshold voltage of each of the first column selection transistors and the second column selection transistors is lower than a threshold voltage of a corresponding one of the first write-only transfer transistor and the second write-only transfer transistor.

5. The semiconductor storage device according to claim 2, wherein a threshold voltage of each of the first read-only drive transistor and the second read-only drive transistor is lower than a threshold voltage of a corresponding one of the first read-only transfer transistor and the second read-only transfer transistor.

6. The semiconductor storage device according to claim 2, wherein each of the first column selection transistor and the second column selection transistor is shared by a plurality of memory cells.

7. The semiconductor storage device according to claim 6, wherein
    the first column selection transistor is shared by a first memory cell and a second memory cell that is adjacent to one side of the first memory cell, and
    the second column selection transistor is shared by the first memory cell and a third memory cell that is adjacent to other side of the first memory cell.

8. The semiconductor storage device according to claim 2, wherein a memory cell array formed of a plurality of the memory cells arranged in an array has a layout in which memory cells adjacent to each other in a row direction are aligned in a same orientation, and memory cells adjacent to each other in a column direction are alternately inverted.

9. The semiconductor storage device according to claim 2, wherein a memory cell array formed of a plurality of memory cells arranged in an array has a layout in which a write bit line is shared by memory cells adjacent to each other in a row direction.

10. The semiconductor storage device according to claim 1, wherein
    the word line includes a write word line and a read word line,
    the write word line is connected to the gate of the first write-only transfer transistor and the gate of the second write-only transfer transistor, and
    the read word line is connected to the gate of the first read-only transfer transistor.

11. The semiconductor storage device according to claim 10, further comprising:
    a second read-only drive transistor whose gate is connected to the drain of the first drive transistor, the drain of the first load transistor, the gate of the second drive transistor, and the gate of the second load transistor;

a second read-only transfer transistor whose drain is connected to a drain of the second read-only drive transistor and whose gate is connected to the read word line; and a second read bit line connected to a source of the second read-only transfer transistor.

12. A semiconductor storage device comprising a memory cell, wherein the memory cell comprises:

a first drive transistor;

a second drive transistor;

a first load transistor connected to the first drive transistor in series;

a second load transistor connected to the second drive transistor in series;

a first write-only transfer transistor whose drain is connected to a gate of the second drive transistor, a gate of the second load transistor, a drain of the first drive transistor, and a drain of the first load transistor;

a second write-only transfer transistor whose drain is connected to a drain of the second drive transistor, a drain of the second load transistor, a gate of the first drive transistor, and a gate of the first load transistor;

a first read-only drive transistor in which a front gate and a back gate are formed, whose front gate is connected to the gate of the first drive transistor, the gate of the first load transistor, the drain of the second drive transistor, and the drain of the second load transistor;

a first read-only transfer transistor whose drain is connected to a drain of the first read-only drive transistor;

a first column selection transistor whose drain is connected to a source of the first write-only transfer transistor;

a second column selection transistor whose drain is connected to a source of the second write-only transfer transistor;

a write word line connected to a gate of the first write-only transfer transistor and a gate of the second write-only transfer transistor;

a read word line connected to a gate of the first read-only transfer transistor;

a first write bit line connected to a source of the first column selection transistor;

a second write bit line connected to a source of the second column selection transistor;

a first read bit line connected to a source of the first read-only transfer transistor; and a column selection line connected to a gate of the first column selection transistor, a gate of the second column selection transistor, and a back gate of the first read-only drive transistor.

13. The semiconductor storage device according to claim 12, further comprising:

a second read-only drive transistor in which a front gate and a back gate are formed, whose front gate is connected to the drain of the first drive transistor, the drain of the first load transistor, the gate of the second drive transistor, and the gate of the second load transistor, and whose back gate is connected to the column selection line;

a second read-only transfer transistor whose drain is connected to a drain of the second read-only drive transistor, and whose gate is connected to the read word line; and a second read bit line connected to a source of the second read-only transfer transistor.

14. The semiconductor storage device according to claim 13, wherein when data is to be written into the memory cell, a potential of one of the first write bit line and the second write bit line, to which a logical value of zero is to be written, is set to a negative value.

15. The semiconductor storage device according to claim 13, wherein a threshold voltage of each of the first column selection transistors and the second column selection transistors is lower than a threshold voltage of corresponding one of the first write-only transfer transistor and the second write-only transfer transistor.

16. The semiconductor storage device according to claim 13, wherein a threshold voltage of each of the first read-only drive transistor and the second read-only drive transistor is lower than a threshold voltage of corresponding one of the first read-only transfer transistor and the second read-only transfer transistor.

17. The semiconductor storage device according to claim 13, wherein each of the first column selection transistor and the second column selection transistor is shared by a plurality of memory cells.

18. The semiconductor storage device according to claim 17, wherein the first column selection transistor is shared by a first memory cell and a second memory cell that is adjacent to one side of the first memory cell, and the second column selection transistor is shared by the first memory cell and a third memory cell that is adjacent to other side of the first memory cell.

19. The semiconductor storage device according to claim 13, wherein a memory cell array formed of a plurality of the memory cells arranged in an array has a layout in which memory cells adjacent to each other in a row direction are aligned in a same orientation, and memory cells adjacent to each other in a column direction are alternately inverted.

20. The semiconductor storage device according to claim 13, wherein a memory cell array formed of a plurality of memory cells arranged in an array has a layout in which a write bit line is shared by memory cells adjacent to each other in a row direction.

* * * * *